United States Patent
Mason et al.

(10) Patent No.: US 8,059,057 B2
(45) Date of Patent: *Nov. 15, 2011

(54) REDUCED INDUCTANCE INTERCONNECT FOR ENHANCED MICROWAVE AND MILLIMETER-WAVE SYSTEMS

(75) Inventors: James S. Mason, Richardson, TX (US); John Michael Bedinger, Garland, TX (US); Raj Rajendran, Plano, TX (US)

(73) Assignee: Raytheon Company, Waltham, MA (US)

( * ) Notice: Subject to any disclaimer, the term of this patent is extended or adjusted under 35 U.S.C. 154(b) by 39 days.

This patent is subject to a terminal disclaimer.

(21) Appl. No.: 12/368,492

(22) Filed: Feb. 10, 2009

(65) Prior Publication Data

US 2009/0267235 A1    Oct. 29, 2009

Related U.S. Application Data

(63) Continuation of application No. 11/145,889, filed on Jun. 6, 2005, now Pat. No. 7,528,792.

(51) Int. Cl.
*H01Q 21/00* (2006.01)
*H01L 23/02* (2006.01)
*H01L 23/34* (2006.01)

(52) U.S. Cl. .................. 343/853; 257/728; 257/773

(58) Field of Classification Search .................. 343/853; 333/245, 247, 260; 174/260; 361/774, 776, 361/795; 257/773, 678, 712, 728, 734, E23.168
See application file for complete search history.

(56) References Cited

U.S. PATENT DOCUMENTS

| | | | |
|---|---|---|---|
| 4,771,294 A | 9/1988 | Wasilousky | |
| 6,057,593 A | 5/2000 | Iovdalsky et al. | |
| 6,246,377 B1 | 6/2001 | Aiello et al. | |
| 6,545,227 B2 * | 4/2003 | Silverman | 174/260 |
| 7,528,792 B2 * | 5/2009 | Mason et al. | 343/853 |
| 2003/0012006 A1 | 1/2003 | Silverman | |
| 2003/0117331 A1 | 6/2003 | Schamberger et al. | |

FOREIGN PATENT DOCUMENTS

| | | |
|---|---|---|
| EP | 0 725 441 A2 | 8/1996 |
| EP | 0 732 745 A2 | 9/1996 |
| EP | 1 280 392 A1 | 1/2003 |
| JP | 60-133992 | 7/1985 |
| JP | 2002290150 | 4/2002 |
| JP | 2003-060116 | 2/2003 |

(Continued)

OTHER PUBLICATIONS

English Translation of Office Action of Japanese Patent Office, Patent Application No. 2008-515735, 16 pages, Dec. 8, 2009.

(Continued)

*Primary Examiner* — Michael C Wimer
(74) *Attorney, Agent, or Firm* — Baker Botts L.L.P.

(57) ABSTRACT

According to one embodiment of the present invention, a microwave or millimeter wave module includes a dielectric layer having a pocket formed substantially through the dielectric layer. The dielectric is attached to a metal substrate. The pocket has substantially vertical sidewalls. An integrated circuit is disposed in the pocket. Opposing sides of the integrated circuit are substantially parallel to the sidewalls of the pocket. An interconnect electrically couples the integrated circuit to a bond pad disposed on the outer surface of the dielectric layer. The interconnect has a length that is minimized to result in reduced inductance of the semiconductor device.

29 Claims, 2 Drawing Sheets

FOREIGN PATENT DOCUMENTS

WO    WO 02/23620 A2    3/2002

OTHER PUBLICATIONS

Edward et al., "W-Band Active Transmit and Received Phased Array Antennas," IEEE MTT-S Digest, pp. 1095-1098, May 16, 1995.

Wein, Advanced Ceramic Packaging for Microwave and Millimeter Wave Applications, IEEE Transactions on Antennas and Propagation, pp. 940-948, Sep. 1, 1995.

PCT Notification of Transmittal of the International Search Report and the Written Opinion, International Application No. PCT/US2006/020014, 13 pages, Dec. 26, 2006.

State Intellectual Property Office of the People's Republic of China, First Office Action, Filing No. 200680020042.5, 13 pages, Aug. 28, 2009.

English translation of The Second Office Action of China IPO, Patent Application 2006-0020042.5, along with Chinese language office action; 28 pages, Jun. 29, 2010.

English translation of Office Action of Japan Patent Office, Patent Application 2008-515735, Mailing date Jun. 15, 2010, 27 pages.

English translation of the Third Office Action of China IPO, Patent Application 2006-0020042.5, along with Chinese language office action; 6 pages, Oct. 9, 2010.

Communication Pursuant to Article 94(3) EPC for Application No. 06 771 020.2-2203; (5 pages), Nov. 10, 2010.

* cited by examiner

REDUCED INDUCTANCE INTERCONNECT FOR ENHANCED MICROWAVE AND MILLIMETER-WAVE SYSTEMS

RELATED APPLICATIONS

This application is a continuation of application Ser. No. 11/145,889 filed Jun. 6, 2005 now U.S. Pat. No. 7,528,792, entitled Reduced Inductance Interconnect for Enhanced Microwave and Millimeter-Wave Systems.

FIELD OF INVENTION

The present invention relates generally to packaging microwave and millimeter wave devices and more particularly to a reduced inductance interconnect for enhancing microwave and millimeter-wave system performance.

BACKGROUND OF THE INVENTION

A radar system typically includes an array of transmit and receive modules/elements, which may be referred to as radiator fins, electrically coupled to an array of associated integrated microwave circuits. Typically, each radiator fin is coupled to an associated integrated circuit by a combination of an electrical channel through an interconnect. Although radar systems typically operate in the X to K band at a frequency on the order of 10 to 35 gigahertz, in some applications it may be desirable to operate a radar system at higher operating frequencies. To operate a radar at high frequencies, however, the radar must include a greater number of radiator fins per square inch. Accordingly, the size of components within the radar system must be decreased.

The length of the interconnect coupling each radiator fin to an integrated circuit, however, is a limiting factor in the development of high frequency radar systems as very low inductive interconnections between devices important for high-frequency applications. Since flip chips have short bond connections between the active integrated circuit and the surrounding substrate, flip chip techniques have been used to combat this problem. Flip chips, however have their disadvantages. Microwave flip chip dies require embedded micro-strip or co-planar wave guide transmission lines to interconnect the passive elements on a semiconductor die to achieve the design function. This results in complex fabrication process and/or compromise in performance. Further, the bumps formed on the surface of the integrated circuit to bond the flipped integrated circuit to the substrate are expensive to form and require complex assembly techniques. Additionally, because coolant flow used to dissipate heat from an integrated circuit is removed from the semiconductor surface in a flip chip design, radar systems incorporating flip chips have thermal failure problems resulting from the inefficiency and inability of the active device to dissipate heat. Complex cooling systems, incorporating thermal bars within the semiconductor die, are needed for flip-chip packages. High operating temperatures result in reduced performance of the flip chip and the substrate supporting the flip chip.

SUMMARY OF THE INVENTION

In accordance with the present invention, a system and method for reducing the inductance of an interconnect is provided that substantially eliminates or greatly reduces disadvantages and problems associated with conventional microwave modules.

According to one embodiment of the present invention, a microwave or millimeter wave module includes a dielectric layer having a pocket formed substantially through the dielectric layer. The dielectric is attached to a metal substrate. The pocket has substantially vertical sidewalls. An integrated circuit is disposed in the pocket. Opposing sides of the integrated circuit are substantially parallel to the sidewalls of the pocket. An interconnect electrically couples the integrated circuit to a bond pad disposed on the outer surface of the dielectric layer. The interconnect has a length that is minimized to result in reduced inductance of the semiconductor device.

Certain examples of the invention may provide one or more technical advantages. A technical advantage of one exemplary embodiment of the present invention is that an integrated circuit may be disposed in a pocket. As a result, the top surface of the integrated circuit may be substantially coplanar with the top surface of the dielectric material in which the integrated circuit is embedded. Another technical advantage may be that, the length of the interconnect coupling the integrated circuit to the dielectric substrate may be decreased. As a result, the inductance of the integrated system may be decreased and performance of the circuit may be improved. Another technical advantage may be that the integrated circuit is supported directly on a metal layer such that heat generated by the integrated circuit may be removed from the semiconductor system through the metal layer.

Still another technical advantage may be that the channel separation distance between channels in a radar system may be decreased to permit high frequency operation and meet design requirements. As a result, a higher density of channels may be accomplished and the number of radiator fins present in the radar system per square inch may be increased. Accordingly, the operating frequency of the radar system may be increased. For example, in particular embodiments, a radar system may be operated at a W-band frequency exceeding 95 gigahertz and may be formed to include 32 channels or more in a single monolithic package.

Other technical advantages may be readily apparent to one skilled in the art from the figures, descriptions and claims included herein. None, some, or all of the examples may provide technical advantages.

BRIEF DESCRIPTION OF THE DRAWINGS

For a more complete understanding of the present invention and its features and advantages, reference is now made to the following description, taken in conjunction with the accompanying drawings, in which like reference numerals refer to like elements, and wherein.

DETAILED DESCRIPTION OF THE INVENTION

In order to form a radar system or other microwave or millimeter wave system, various conductive and nonconductive layers are typically formed on a suitable thermal substrate or other non-thermal substrate. FIGS. 1A-1E are cross-sectional views of an example microwave and/or millimeter wave structure ("microwave/millimeter wave structure") 10 during the formation of multiple layers on an outer surface of a metal layer 14. Semiconductor microwave/millimeter wave structure 10 may be used as a basis for forming any of a variety of microwave/millimeter wave devices, such as a radar system incorporated into a missile or other aerospace platform or other high frequency communication system. Particular examples and dimensions specified throughout this document are intended for exemplary purposes only, and are not intended to limit the scope of the present disclosure. Moreover, the illustrations in FIGS. 1A-1E are not intended to be to scale. As will be discussed in more detail below, conventional microwave module fabrication techniques for forming semiconductor based devices typically include the wire bonding of an integrated circuit to other conductive features or devices. The wire bond forms an interconnect. Where the integrated circuit is supported on a top surface of a circuit board substrate, the interconnect may be of a length sufficient to result in larger inductance and reduced performance in high frequency applications. According to various embodiments, however, such defects may be greatly reduced or substantially limited.

Figure 1A:
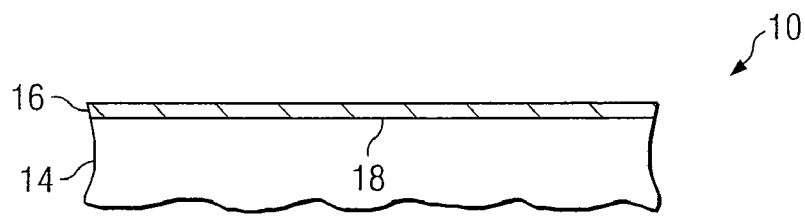
FIGS. 1A-1E are cross-sectional diagrams showing the formation of multiple layers on an outer surface of a microwave or millimeter wave substrate in accordance with one embodiment of the present invention.

FIG. 1A is a cross-sectional view of microwave/millimeter wave structure 10 after the formation of multiple layers on a metal layer 14. Metal layer 14 may comprise any suitable material used in the fabrication of microwave structures. For example, in particular embodiments, metal layer 14 may include copper, copper molybdenum, alloy 46, KOVAR, aluminum, or other conductive material. In other embodiments, metal layer 14 may be replaced with a ceramic substrate such as alumina, aluminum nitride, beryllium oxide, and silicon. Because metal layer 14 is conductive, metal layer 14 may operate as a heat sink by enhancing heat dissipation from a heat-generating component supported on metal layer 14 to a cooler ambient. Thus, in various embodiments, the primary purpose of metal layer 14 may be to maintain the temperature of microwave/millimeter wave structure 10 below a maximum allowable temperature specified by the device manufacturers and function as an electrical ground plane. Although metal layer 14 is described as including a metal material, however, it is recognized that other suitable heat dissipating materials may be used to support the various layers formed to create 10. For example, in particular embodiments, metal layer 14 may be replaced with a ceramic layer or printed wiring board with metal plane as the top layer.

In the illustrated embodiment, an adhesion metal layer 16 is formed outwardly from an outer surface 18 of metal layer 14. In particular embodiments, adhesion metal layer 16 may include titanium, tungsten, chromium, gold, copper, nickel, or other metallic material or combination of materials that is sputtered on outer surface 18 of 10. Adhesion metal layer 16 may be of a thickness on the order of 0.05 to 1 micrometers (μm). The primary purpose of adhesion metal layer 16 is to adhere any subsequently formed layers to metal layer 14 and to provide a nucleation layer for electroplated film. In an exemplary embodiment, adhesion metal layer 16 may also act as a contact for electroplate material. Adhesion metal layer 16 may comprise an under-die metallurgy (UDM) and may include a stack of metals and/or metal alloys. Example metals that may be used include titanium, tungsten, copper, nickel, vanadium, cobalt, chromium, gold, or suitable combinations of the above. Thus, many modifications and substitutions may be made to the formation of metal layer 14. For example, metal layer 14 may be replaced with a ceramic layer or a printed wiring board with a metal plane as the top layer. All such modifications and substitutions are within the scope and spirit of the present invention.

Figure 1B:
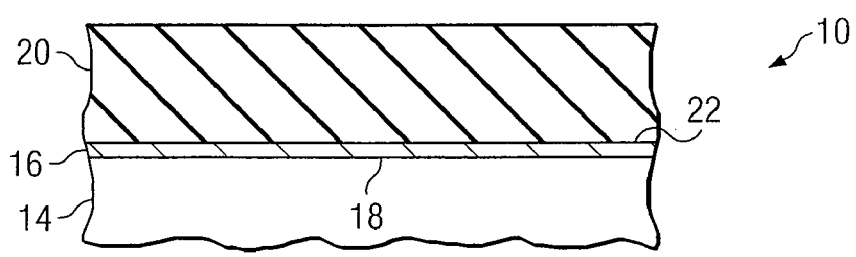

FIG. 1B is a cross-sectional view of microwave/millimeter wave structure after the formation of a dielectric layer 20 on the outer surface 22 of adhesion metal layer 16. Dielectric layer 20 may comprise one or more layers of silicon dioxide, silicon nitride, gallium arsenide, alumina, aluminum nitride, polyimide, various polymers such as teflon, thermo plastics such as liquid crystal polymer, or combinations thereof. In other embodiments, dielectric layer 20 may comprise other types of dielectrics (such as high-k dielectrics). Depending on the materials used to form dielectric layer 20 and the fabrication processes employed, dielectric layer 20 may be formed using any of a variety of processes. For example, in one exemplary embodiment dielectric layer 20 may be formed by growing an oxide or nitrided oxide layer. Conversely, where dielectric layer 20 comprises polymers, dielectric layer 20 may be formed by spin coating and curing a layer of dielectric liquid. Alternatively, a dielectric film may be attached using an autoclave or other appropriate equipment. The dielectric film may be subjected to varied temperatures, a pressure sequence, and/or vapor deposition.

The thickness of dielectric layer 20 is related to the frequency range at which semiconductor microwave/millimeter wave structure 10 will ultimately operate. The higher the frequency at which the structure 10 is operated, the thinner dielectric layer 20 may be. For example, where semiconductor microwave/millimeter wave structure 10 is operated at a frequency in excess of 10 gigahertz, dielectric layer 20 may be of a thickness on the order of approximately 1 to 10 mils depending on the value of dielectric constant. As another example, where semiconductor microwave/millimeter wave structure 10 is operating at a frequency on the order of 30-35 gigahertz, dielectric layer 20 may be of a thickness on the order of approximately 2 to 4 mils. As still another example, where semiconductor microwave/millimeter wave structure 10 is operating at a frequency exceeding 95 gigahertz, dielectric layer 20 may be of a thickness on the order of 1 to 2 mils.

Figure 1C:
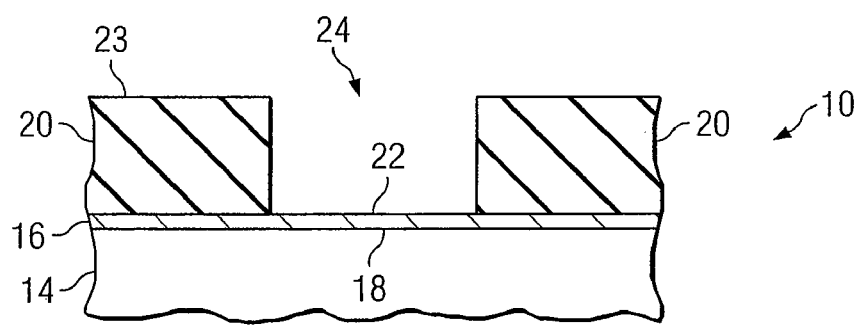

Following the formation of dielectric layer 20, a pocket may be formed in at least a portion of the surface of layer 20. FIG. 1C is a cross-sectional view of semiconductor microwave/millimeter wave structure 10 after the formation of a pocket 24 in the outer surface 23 of dielectric layer 20. In the illustrated exemplary embodiment, pocket 24 is formed to expose at least a portion of outer surface 22 of metal adhesion layer 16. Pocket 24 may include an ablated pocket with substantially vertical sidewalls. Accordingly, pocket 24 may be formed using laser ablation, which is a mask-less direct write process. The laser ablation process used to form pocket 24 may eliminate the need for traditional photolithography steps such as resist coat, expose, develop, etch, and strip resist. In other embodiments, pocket 24 may be formed using an etch process that may include a dry etch, a plasma etch, a plasma assisted etch, or a wet etch. The etch may be selectable to the material comprising dielectric layer 20, such that a portion of dielectric layer 20 is removed by the etch process.

As will be described in more detail below, pocket 24 is formed in the surface of dielectric layer 20 to house an integrated circuit. Thus, the dimensions of pocket 24 relate to the dimensions of the integrated circuit to be disposed in pocket 24. For example, where the integrated circuit has a width on the order of 3 to 100 mils, pocket 24 may have a width on the order of approximately 5 to 102 mils, and in some example embodiments to a width of approximately 100 mils. Similarly, where the integrated circuit has a depth on the order of 1 to 9 mils, pocket 24 may be formed to a depth on the order of approximately 2 to 10 mils, and in some example embodiments to a depth of approximately 6 mils. Although pocket 24 is typically larger than the integrated circuit housed within pocket 24, it is generally desirable that the gap between the integrated circuit and the sidewalls of pocket 24 is minimized. A further object of the present invention is to embed the integrated circuit within pocket 24 such that the outer surface of the integrated circuit is substantially co-planar with an outer surface 23 of dielectric layer 20. As will be described in more detail below with regard to FIG. 1E, such a configuration reduces the length of an interconnect, or interconnection, formed to couple the integrated circuit to an associated bond pad. As a result, the intrinsic inductance of the interconnect is minimized. The teachings of the invention recognize that this length can be shortened by precisely locating pocket 24, precisely forming the dimensions of pocket 24, precisely controlling the vertical slope of the walls of pocket 24, and/or by precisely controlling the size of the integrated circuit. According to one embodiment, the slope of the walls of pocket 24 do not exceed 0.8 mils/mil, and in one particular embodiment the slope is approximately 0.3 mils/mil.

Following the formation of pocket 24, laser micro-machining processes together with cleaning processes may be used to achieve the desired sidewall topology of pocket 24. The laser micro-machining process may include using a frequency tripled Yttrium Aluminum Gallium (YAG) laser at a frequency of 350 nanometers. Laser micromachining enables the single-step fabrication of a high-aspect ratio pocket 24. Specifically, the sidewalls of pocket 24 may be substantially vertical rather than sloped and may be substantially parallel with the sides of the integrated circuit. Furthermore, the size of pocket 24 may more precisely correspond with the size of the integrated circuit to be embedded in pocket 24. As a result, the amount of space between the embedded integrated circuit and the sidewalls of pocket 24 may be reduced and bond pads may be more closely located proximate the integrated circuit. Accordingly, whereas conventional techniques resulted in a minimum space of approximately 20 mils between the integrated circuit and a bond pad disposed on the surface of dielectric layer 20, laser micro-machining processes may result in a space of approximately 1 to 2 mils between each side of the integrated circuit and the corresponding sidewall of pocket 24. As a further advantage, laser micromachining allows pocket 24 to have a diameter/height ratio as low as approximately 0.5 through a dielectric as thick as approximately 4 mils, wherein the diameter of the pocket corresponds with the width and the height of the pocket corresponds with the length of the pocket in layer 20. The thickness of the dielectric in which pocket 24 is formed is determined by the Radio Frequency/microwave design for loss transmission. The diameter of the pocket is determined by the semiconductor die size.

Figure 1D:
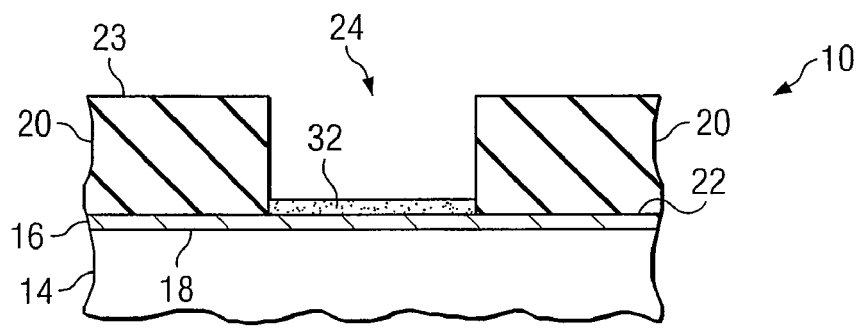
Figure 1E:
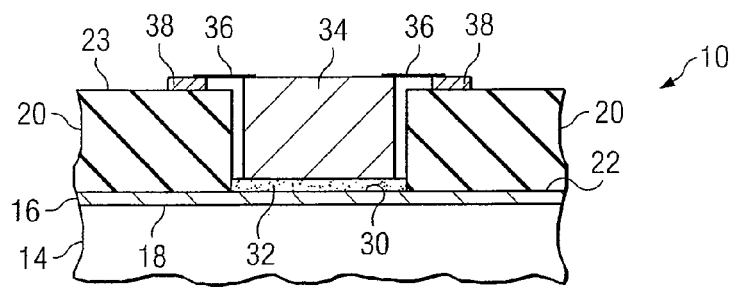

After the formation of pocket 24, an epoxy may be applied to a portion of the exposed surface 22 within pocket 24. FIG. 1D is a cross-sectional view of semiconductor microwave/millimeter wave structure after the formation of an epoxy layer 32 within pocket 24. Epoxy layer 32 may be dispensed in pocket 24. In particular embodiments, epoxy layer 32 is comprised of a conductive epoxy such as ablebond 8360, ablebond 8390, and ablebond 8340, or another semiconductive adhesive. As will be described in more detail below, the purpose of epoxy layer 32 is to adhere an integrated circuit to outer surface 22 of adhesion metal layer 16, such that the integrated circuit is substantially embedded in pocket 24.

In the illustrated embodiment, epoxy layer 32 coats exposed surface 22. The substantially vertical sidewalls of pocket 24, however, are left substantially uncoated. To prevent the coating of the sidewalls of pocket 24, the amount of epoxy may be carefully controlled so that a minimum amount is used. The minimum amount may result in a thin epoxy filet formed around the bottom perimeter of the integrated circuit. The advantages to such a configuration will be more readily understood in the context of FIG. 1E, which is a cross-sectional view of 10 after an integrated circuit 34 is placed in pocket 24 and an interconnect 36 is formed. Integrated circuit 34 includes a single piece of semiconductor wafer which has not yet been packaged. In specific embodiments, integrated circuit 34 includes an integrated circuit operable to perform radar signal processing functions. In particular embodiments, for example, integrated circuit 34 may include an integrated circuit with the appropriate circuitry for causing the transmission and reception of electromagnetic radiation by radar components and for processing such signals associated with electromagnetic radiation.

For interconnection of integrated circuit 34, one or more bond pads 38 may be positioned on dielectric layer 20. Bond pads 38 may include a layer of gold or other conductive material positioned proximate pocket 24 such that interconnect 36 may be formed to couple integrated circuit 34 to bond pad 38. In particular embodiments, bond pads 38 may have lateral dimensions on the order of 2 to 10 mils and may be positioned a distance of approximately 0 to 4 mils from one of the sidewalls of pocket 24, and in a particular embodiment, about one mil from one of the sidewalls of pocket 24. Smaller sized bonds pads 38 are used to minimize capacitance effects, which can diminish the effectiveness of a high frequency device.

Bond pads 38 are connected to integrated circuit 34 using interconnect 36. In particular embodiments, interconnect 36 includes a bond wire made with ribbon of a diameter on the order of 1 to 3 mils. Interconnect 36 may be thermosonically bonded with a force of 15 gm force to 90 gm force. A minimum amount of ultrasonic energy, however, should be applied to achieve reliable bonds. In particular embodiments, interconnect 36 may operate as a micro-strip interconnect. To reduce inductance, it may be desirable to minimize the length of interconnect 36. Accordingly, bond pads 38 may be positioned as close to pocket 24 as possible. As a result, interconnect 36 may include a bond wire of a length of less than 15 mils. In more particular embodiments, this length may be from 3 to 15 mils and may, for example, have a length of approximately 3 or 4 mils.

Because the width of integrated circuit 34 is less than the width of pocket 24, a void (not explicitly shown) is present beneath each interconnect 36. The air-filled dielectric voids result in the improved performance of interconnects 36. It is for this reason that a minimum amount of epoxy may be desired when forming epoxy layer 32. Where too much epoxy material is used and epoxy layer 32 creeps up on to the sidewall surfaces of pocket 24, the capacitance between ground layer 14 and interconnect 36 may increase. Where semiconductor microwave/millimeter wave structure 10 is implemented in a radar application, an ineffective or failing interconnect 36 may cause the failure of the radar system.

Figure 2:
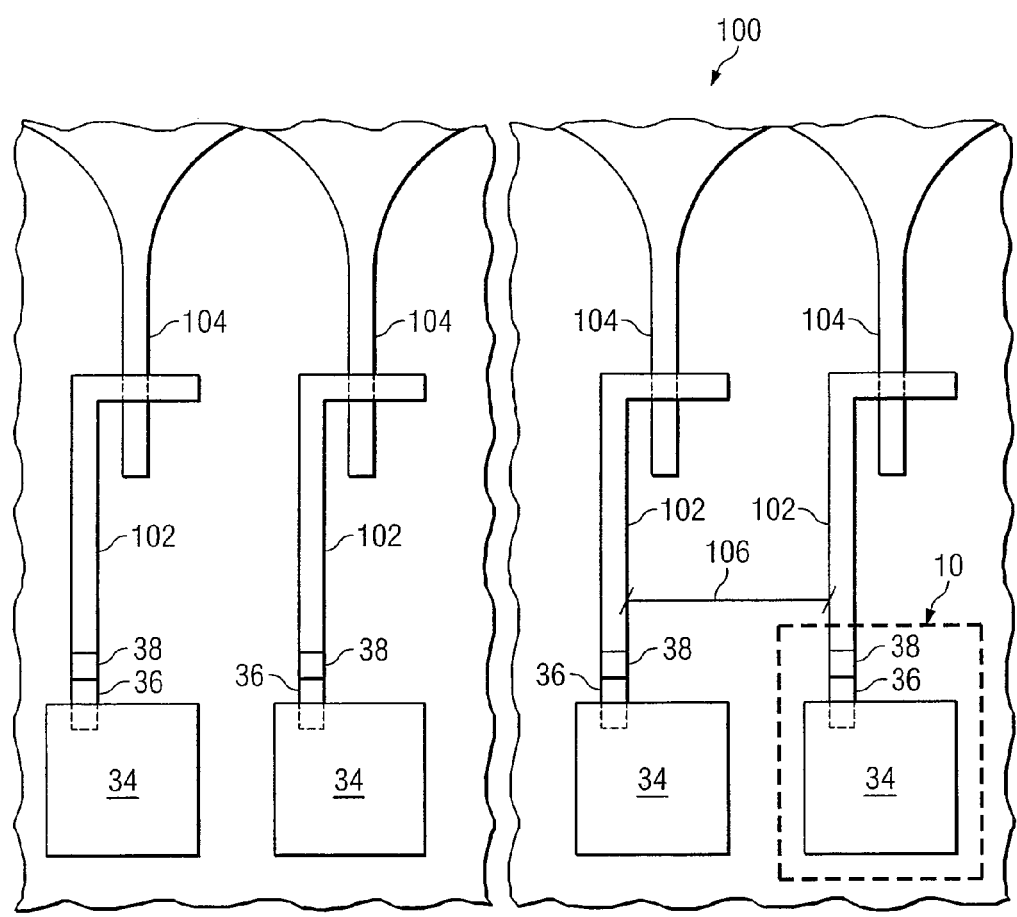
FIG. 2 is a top view of a radar system in accordance with one embodiment of the present invention.

FIG. 2 is a top view of a radar, communication or other microwave and/or millimeter wave system 100 incorporating structure 10 in accordance with one embodiment of the present invention. Radar system 100 includes a plurality of embedded integrated circuits 34, a plurality of transmission lines, or transmission lines/launch structures, 102, and a plurality of radiators 104. In particular embodiments, radar system 100 operates at a high-frequency ranges exceeding 10 gigahertz. Thus, radar system 100 may operate in the Ka-band between 30 and 35 gigahertz. Alternatively or additionally, radar system 100 may operate in the W band at frequencies exceeding 95 gigahertz. Accordingly, it is contemplated that radar system 100 may operate at any of a variety of frequencies within a range on the order of 1 to 200 gigahertz. In various embodiments radar or communication system 100 may include solid state circuitry for transmitting and receiving electromagnetic radiation for the detection of objects, aircraft, spacecraft, ships, or ground-based targets.

The plurality of radiators 104 in radar system 100 include both transmit and receive elements positioned in a phased array. Each radiator is coupled to an associated integrated circuit 34 by transmission line/launch structure 102. Transmission line/launch structures 102 are formed on the dielectric layer 20 by conventional photo-lithographic processes. Each transmission line/launch structure 102 may then be electrically coupled to an integrated circuit 34 through dielectric layer 20 using an interconnect 36 configured as described above with regard to FIG. 1E. It is noted that in the embodiment of FIG. 2, transmission line/launch structure 102 is electronically coupled to radiator 104 even though a dielectric layer 20 is disposed between the two (not explicitly shown).

The number and relative size of radiator 104 included in a particular radar system is related to the wavelength frequency at which the radar system is operated. For example, a radar system operating in the X-band frequency may have approximately 2.6 radiator fins 104 per square inch. By comparison, a radar system operating in the K-band frequency may have approximately 32 radiator fins 104 per square inch, and a radar system operating in the W-band frequency may have approximately 250 radiator fins 104 per square inch. Accordingly, it can be understood that as the operating frequency of the radar system is increased, it becomes necessary to increase the number of and decrease the size of radiator fins 104 and other components of radar system 100. As a result, the channel separation distance 106 between each transmission line/launch structures 102 has been a factor limiting the operating frequency of conventional radar systems.

Because radar system 100 may be formed by embedding integrated circuits 34 in pockets 24 and the length of interconnect 36 can be minimized, however, radar system 100 may be operated at higher operating frequencies than conventional radar systems. For example, and as described above with regard to FIGS. 1A-1E, pocket 24, which includes a laser ablated pocket formed in the surface of dielectric layer 20 using conventional etch techniques and laser micromachining processes, bond pad 38 may be positioned closer to integrated circuit 34 than in conventional radar systems. As a result, interconnect 36 may be shorter, and the distance between each integrated circuit 34 may be decreased to facilitate higher frequency operation. In particular embodiments, for example, the channel separation distance 106 may be on the order of 0.03 to 1.0 inches. Where the distance between each integrated circuit 34 is decreased, the distance between each radiator 104 may also be decreased. As a direct correlation, channel separation distance 106 may also be decreased, and higher operating frequencies may be achieved. For example, in an exemplary embodiment, radar system 100 may be operated at a frequency exceeding 96 gigahertz.

Although the present invention has been described in detail, it should be understood that various changes, alterations, substitutions, and modifications can be made to the teachings disclosed herein without departing from the spirit and scope of the present invention which is solely defined by the appended claims.

What is claimed is:

1. A structure comprising:
    a dielectric layer having a pocket with substantially vertical sidewalls formed through the dielectric layer;
    at least one trace formed on a first side of the dielectric layer, at least one trace coupled to a bond pad adjacent one of the substantially vertical sidewalls;
    a metal ground plane attached to the dielectric layer on a second side of the dielectric layer that is opposite the first side of the dielectric layer;
    an integrated circuit disposed in the pocket, the integrated circuit having opposing sides substantially parallel to the vertical sidewalls;
    an adhesion metal layer formed between the integrated circuit and the metal ground plane beneath the pocket, the adhesion metal layer extending between the dielectric layer and the metal ground plane beyond the substantially vertical sidewalls of the pocket;
    an interconnection between the integrated circuit and the bond pad; and
    wherein the length of the interconnection is less than 15 mils, and
    wherein the metal ground plane is configured to provide structural support and operate as a heat sink by enhancing heat dissipation from the integrated circuit.

2. The structure of claim 1, wherein a thickness of the dielectric is selected to:
    achieve co-planarity based on device a thickness of the integrated circuit;
    obtain a controlled microwave impedance;
    minimize via inductance and microwave loss in the dielectric for higher frequency operation; and
    obtain precise control of pocket dimensions and sidewall characteristics.

3. The structure of claim 1, wherein:
    the vertical sidewalls of the pocket are formed using laser micro-machining;
    the pocket is formed to a depth on the order of one mil greater than a height of the integrated circuit; and
    wherein the length of the interconnection is between 3 and 15 mils.

4. The structure of claim 1, wherein the vertical sidewalls of the pocket are formed using laser micro-machining.

5. The structure of claim 1, wherein the pocket is formed to a depth on the order of one mil greater than a height of the integrated circuit.

6. The structure of claim 1, wherein a distance between at least one of the opposing sides of the integrated circuit and a corresponding one of the substantially vertical sidewalls is less than one mil.

7. The structure of claim 1, wherein the length of the interconnection is between 3 and 15 mils.

8. The structure of claim 1, wherein the length of the interconnection is approximately 3 mils.

9. The structure of claim 1, wherein the bond pad is positioned a distance of approximately 0 to 1 mils from the one of the substantially vertical sidewalls of the pocket.

10. The structure of claim 1, wherein the integrated circuit operates to perform radar, communication and other microwave and millimeter wave functions.

11. The structure of claim 1, further comprising:
    an array of radiators comprising a plurality of transmit and receive channels;
    the system is a system selected from the group consisting of a radar system, a communication system, a microwave system, and a millimeter wave system;
    the dielectric layer is a thin dielectric layer having a thickness that is less than ten mils;
    the integrated circuit is selected from the group consisting of a microwave circuit, a millimeter wave circuit, and a discrete semiconductor component;
    the substantially vertical sidewalls are precisely dimensioned vertical sidewalls;

the ground plane is a metal thermal and electrical ground plane;

the integrated circuit has a surface substantially coplaner to the at least one channel; and;

the interconnection has a length resulting in a high frequency, low loss transition for the system.

12. The structure of claim 11, wherein the array of transmit and receive channels are:

formed to achieve low cost and the positional and dimensional precision needed for high frequency operation;

are closely spaced and fabricated as a single unit to minimize RF transitions, meet stringent spatial requirements and low transmission loss; and formed on a machined structural metal base to contact heat generating semi-conductors to efficiently dissipate heat.

13. The structure of claim 11, wherein the array of radiator operate to transmit and receive electromagnetic radiation of a frequency exceeding 90 gigahertz.

14. The structure of claim 11, wherein the array of radiator operate to transmit and receive electromagnetic radiation of a frequency on the order of 1 to 200 gigahertz.

15. The structure of claim 1, wherein a top surface of the integrated circuit is coplanar with a top surface of the dielectric layer.

16. The structure of claim 1, wherein the bond pad is positioned a distance of approximately 0 to 1 mils from one of the vertical sidewalls of the pocket.

17. The structure of claim 1, wherein the integrated circuit is directly supported on the ground plane attached to the dielectric layer, the ground plane operable to transfer heat generated by the integrated circuit to an underlying metal layer and act as a cold plate, allowing spreading of heat and efficient extraction of heat.

18. The structure of claim 1, further comprising:

a plurality of integrated circuits, each integrated circuit disposed in an associated pocket;

a plurality of traces formed on the first side of the dielectric layer;

a plurality of bond pads disposed on the metal substrate, each of the plurality of bond pads associated with a selected one of the plurality of traces; and a plurality of interconnections, each of the plurality of interconnections electrically coupling a selected one of the integrated circuits to a selected one of the bond pads, each of the interconnections having a length of less than 15 mils that is selected to result in reduced inductance of the semiconductor device.

19. The structure of claim 1, wherein the metal ground plane is replaced with a layer of ceramic.

20. The structure of claim 1, wherein the adhesion metal layer operates as a nucleation layer and contact for an electroplated film.

21. The structure of claim 1, wherein the adhesion metal layer is of a thickness between 0.05 to 1 micrometers.

22. The structure of claim 1, wherein the metal ground plane is substantially thicker than the adhesion metal layer.

23. The structure of claim 1, wherein:

the metal ground plane is formed from a first material selected from the group consisting of copper, copper molybdenum, aluminum, and any material containing a conductive metal; and the adhesion metal layer is formed from a second material selected from the group consisting of titanium, tungsten, chromium, gold, copper, and nickel.

24. The structure of claim 1, wherein the metal ground plane is comprised of copper and the adhesion metal layer is comprised of gold.

25. The structure of claim 1, wherein the interconnect comprises ribbon wire that lies substantially parallel to the first side of the dielectric layer.

26. The structure of claim 1, wherein the dielectric layer is of a thickness of approximately 1 and 2 mils, and the structure operates at frequency exceeding 95 gigahertz.

27. The structure of claim 1, wherein the dielectric layer is of a thickness of approximately 2 to 4 mils.

28. The structure of claim 1, wherein the bond pad has lateral dimensions between 2 to 10 mils and is positioned a distance between 0 to 4 mils from one of the sidewalls of pocket 24.

29. The structure of claim 1, wherein the bond pad has lateral dimensions between 2 to 10 mils and is positioned a distance of approximately 1 mil from one of the sidewalls of pocket 24 and the length of the interconnection is between 3 to 4 mils.

* * * * *